United States Patent
Hibbs et al.

(10) Patent No.: US 9,663,308 B2
(45) Date of Patent: May 30, 2017

(54) TRANSPORT SYSTEM WITH MAGNETICALLY DRIVEN TRANSPORT ELEMENTS AND TRANSPORTATION METHOD

(71) Applicant: Robert Bosch GmbH, Stuttgart (DE)

(72) Inventors: Richard Hibbs, Mierlo (NL); Kees van Loon, Veldhoven (NL)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/921,740

(22) Filed: Oct. 23, 2015

(65) Prior Publication Data

US 2016/0114989 A1 Apr. 28, 2016

(30) Foreign Application Priority Data

Oct. 27, 2014 (EP) .................................. 14190405

(51) Int. Cl.
*B65G 54/02* (2006.01)
*H01L 21/677* (2006.01)

(52) U.S. Cl.
CPC ........ *B65G 54/02* (2013.01); *H01L 21/67736* (2013.01); *H01L 21/67766* (2013.01); *H01L 21/67778* (2013.01)

(58) Field of Classification Search
CPC .............. B65G 54/02; H01L 21/67766; H01L 21/67778; H01L 21/67736; H01L 21/67709; H01L 21/67733; H01L 21/67715; H01L 21/6773; H01L 21/67724; H01L 21/677; H01L 21/67727; H01L 21/67751

(Continued)

(56) References Cited

U.S. PATENT DOCUMENTS 3,173,557 A * 3/1965 Eliassen ................. B65G 43/08
198/347.4
3,453,543 A * 7/1969 Lode ........................ G01R 1/28
324/98

(Continued)

FOREIGN PATENT DOCUMENTS

EP 2 605 098 A1 6/2013

OTHER PUBLICATIONS

European Search Report corresponding to EP Application No. 14190405.2, mailed Apr. 15, 2015; European Patent Office, Munich, Germany; (7 pages).

*Primary Examiner* — Jeanette E Chapman
(74) *Attorney, Agent, or Firm* — Maginot, Moore & Beck LLP

(57) ABSTRACT

A transport arrangement configured to transport piece goods includes a first transport track, a first carrier which is movable with respect to this first transport track, a second transport track, and preferably a second carrier which is movable with respect to this second transport track. The arrangement further includes at least one first coil arrangement configured to move the first carrier with respect to the first transport track and at least one second coil arrangement configured to move the second carrier with respect to the second transport track. At least one coil arrangement is provided to move at least at times the first carrier with respect to the first transport track and at least at times to move the second carrier with respect to the second transport track.

10 Claims, 2 Drawing Sheets

(58) Field of Classification Search
USPC ........ 104/88.01–99.04, 281–284; 198/347.4, 198/435, 463.3, 580, 468.6
See application file for complete search history.

(56) References Cited

U.S. PATENT DOCUMENTS

| | | | |
|---|---|---|---|
| 5,651,820 A * | 7/1997 | Ogasawara | B05B 13/0221 |
| | | | 118/320 |
| 6,609,605 B1 * | 8/2003 | Linder | B65G 47/5104 |
| | | | 198/347.1 |
| 8,245,834 B2 * | 8/2012 | Okubo | G06Q 10/047 |
| | | | 198/349 |
| 2003/0129045 A1 * | 7/2003 | Bonora | H01L 21/67766 |
| | | | 414/217 |
| 2007/0013642 A1 * | 1/2007 | Yoon | B65G 35/06 |
| | | | 345/100 |
| 2009/0255924 A1 * | 10/2009 | Lovens | H05B 6/104 |
| | | | 219/645 |
| 2013/0026005 A1 * | 1/2013 | Senn | B65G 47/082 |
| | | | 198/465.2 |
| 2013/0313072 A1 * | 11/2013 | van de Loecht | B65G 54/02 |
| | | | 198/464.1 |

* cited by examiner

TRANSPORT SYSTEM WITH MAGNETICALLY DRIVEN TRANSPORT ELEMENTS AND TRANSPORTATION METHOD

This application claims priority under 35 U.S.C. §119 to patent application number EP 14190405.2, filed on Oct. 27, 2015 in the European Patent Office, the disclosure of which is incorporated herein by reference in its entirety.

BACKGROUND

The present disclosure is directed to a transport system or a transport arrangement especially for transporting piece goods as for example wafers or the like.

In the state of the art different transport systems are known, which use various systems or carrier systems to transport articles. The disclosure is described with respect to a machine for chemically polishing wafers. However, it is pointed out that the disclosure may also be used in other transport arrangements.

In the state of the art transport systems are known, which use for example permanent magnets and coils to produce a relative movement especially a movement in a linear direction. This principle has been applied since a long time for example in linear motors.

In one transport system known from the state of the art carriers are included which may be transported from two load positions to two process chambers. The transport system uses here a shared middle return track to transport the carriers back to the two load positions. This transport system consists of three horizontal linear motion systems (LMS-tracks). An upper and a lower track serve as a transport to the two process stations and the middle track as a return track as mentioned for the carriers. Furthermore, two vertical tracks, for example on the left and the right side of horizontal tracks are provided. These may be linear motor tracks with each two rotor or secondary parts which work as shuttles for the carrier. In all four shuttles a LMS-coil is mounted. This LMS-coil is moved by the shuttles and can therefore belong to two of the three LMS-coils.

In another machine known from the state of the art several LMS-tracks transport the carrier through the different process chambers in a for example counterclockwise direction. For this purpose several LMS-tracks are necessary. The carrier that is used covers multiple coils. This means that when the carrier is transported from one track to another, multiple coils are involved. To transport the carrier from for example a track 0 to a track 1 at least two coils of track 0 must be moved to the beginning of track 1. This also occurs between track 1 and 2 for example and other couples of tracks.

This movement of coils is however difficult to achieve. It is therefore one purpose of the disclosure to facilitate the movements and especially to facilitate the handling of movable coils.

SUMMARY

This purpose is met by the object of the disclosure. Advantages and embodiments are object of the following description.

A transport arrangement for transporting piece goods according to the disclosure has a first transport track, a first carrier which is movable with respect to this first transport track, a second transport track and preferably also a second carrier which is movable with respect to this second transport track. Furthermore, the arrangement comprises at least one coil arrangement for moving the first carrier with respect to the first transport track and at least one second coil arrangement which moves at least one carrier and especially the second carrier with respect to the second transport track.

According to the disclosure at least one coil arrangement is provided to move at least at times the first carrier with respect to the first transport tracks and at least at times the second carrier with respect to the second transport track. It is therefore suggested that at least one coil is used both for this first track and the second track. it is in this case possible that a certain coil can be displaced from one track to the other, but it is also possible that a certain coil is switched electrically to be a part of the first track or to be a part of the second track. The arrangement according to the disclosure allows that a running mode may be maintained, even if the coil is used for two different tracks. In a further embodiment at least one carrier and preferably two carriers are movable in a predetermined direction and especially along a non-closed part.

Preferably the at least two tracks are completely separate from each other.

In another embodiment of the disclosure at least two tracks extend at least partially parallel and/or perpendicular. It is therefore possible that a plurality of tracks is present, wherein a part of these tracks extend in parallel direction and a part of these tracks extend in directions which are perpendicular to each other. Preferably also a plurality of carriers is provided and very preferably the number of carriers at least equals but preferably exceeds the number of tracks. Preferably at least two carriers maybe moved independently from each other with respect to the same track.

In another preferred embodiment at least one track, preferably more tracks and preferably all tracks are rectilinear. However, it would also be possible that the tracks are curved or have curved sections.

Also it would be possible that the arrangement comprises tracks which are rectilinear and other tracks which have curved sections and/or are curved.

In another preferred embodiment there are more than one coil arrangements which serve for more than one transport tracks. Generally coils are used to control and/or move the carriers on a track. The system can consist of multiple tracks, but usually a coil can only be part of one track at a time. With the new functionality a physical set of coils can be moved to another track while the machine remains operational. A physical set of coils consists usually of a single coil or multiple coils. In case of multiple coils, these multiple coils are preferably moved together. A physical set of coils can preferable only be moved to another track, if they are at the beginning or the end of the track. The coils are preferably moved to another track along with sensors they may comprise.

In another preferred embodiment also the carrier comprises a magnet and/or a magnetizable element. Therefore, the coils corporate with the magnets provided at the carriers and serve to move the carriers with respect to the tracks.

In another preferred embodiment the coil arrangement is provided to either move the first carrier with respect to the first transport track or to move the second carrier with respect to the second transport track. In other words, especially at a specific point in time a certain coil arrangement serves to either move a carrier with respect to the first track or a carrier with respect to the second track. Therefore at least one coil arrangement serves for moving the carriers with respect to either the first or the second track.

In another preferred embodiment at least one coil arrangement is displaceable between the first transport track and the second transport track. Very preferably the coil arrangement is displaceable between at least one end section of one transport track to a section of another track. Preferably the section of the other transport track is also an end section.

In another preferred embodiment each track has two end sections. This means preferably that the tracks are not closed.

In another preferred embodiment at least one coil arrangement comprises at least one, preferably at least two coils. Also a coil arrangement may comprise a plurality of coils and/or a set of coils, for example three or more coils.

Preferably the coils of a coil arrangement can be energized independently of each other. Preferably at least one coil and preferably all coils are electrically driven coils. Therefore, the coils preferably contain an electrical conductor.

In another very preferred embodiment at least one section of the first track is arranged adjacent to at least one section of the second track. Preferably the end section of the first track is arranged adjacent to the at least one end section of the second track. Preferably the end sections change when the coil is added or removed. This means, if a coil is removed from a certain track, the end section of this track will be defined by the coil which is now arranged in this end section. Preferably the coil which can be moved between two tracks defines at times an end section of the first track and at times and end section of the second track.

In another preferred embodiment at least one section of the first track comprises at least in times a receiving space for receiving a coil arrangement. Preferably all tracks comprise at least one receiving space for receiving coil arrangements. Preferably at least one coil can be moved from the receiving space of a first track to the receiving space of the second track.

In another preferred embodiment a coupling mechanism is provided which at least in times couples a carrier to a coil arrangement. Very preferably the coupling mechanism couples the carrier to the coil mechanically. It is therefore possible to move in this situation the carrier together with the coil. However, the coupling mechanism can be unlocked again after the coil has been displaced. In this preferred embodiment the carrier itself is used to transfer a coil. Especially a coupling arises for transferring the carrier and/or the coil from one track to the other. Very preferably the coupling between the coil and the carrier may be actuated automatically and especially can be abled and disabled automatically.

In another very preferred embodiment the carrier in other situations especially when it is conventionally moved along the track is moved with respect to the coils.

In another very preferred embodiment at least some of the coils are arranged stationary. Especially coils other than the coils in the end sections are always stationary. In another preferred embodiment the carrier stands still with respect to the coil during a transport to another track (especially since the coil arrangement is coupled to the carrier in this situation).

It is for example possible that a single physical coil can be transported between the end of a certain track and the beginning of another track. Also a single physical coil can be transported between the end of two other tracks to the beginning of another track. This means that the beginning of a certain track 1 consists of no coil or two physical different coils.

It is also possible that a physical set of two coils may be transported between the beginning of track two and the beginning of another track 3. If a carrier is for example above the coils which is moved to another track, the carrier will be removed from its track and added to the new track as well. The carrier will preferably remain locked while it is moved to the new track. A carrier ID belongs preferably to the carrier and may not be assigned to another carrier in the system. When the coil is added to another track, the carrier may adapt the position definition of the new track.

Preferably therefore at least one carrier comprises an identification. This identification preferably unambiguously defines this carrier. As mentioned above, this ID preferably may not be changed or assigned to another carrier.

In another preferred embodiment at least one coil arrangement and/or at least one carrier comprises a sensor device for sensing at least one characteristic feature of the arrangement. Especially the sensor device is arranged at the coil arrangement. This characteristic feature may be for example a position of the coil and/or the carrier with respect to the track. Also other physical parameters may be evaluated as for example a speed of a carrier with respect to the track, a distance between two carriers or the like.

Also a characteristic feature may be the position of a coil with respect to the track and/or the position of a coil with respect to the carrier.

In another preferred embodiment a track layout may only change when the track is in an active or an idle state. When the coil detects multiple carriers or a part of one carrier, removing of a coil is not possible. When the coil is removed, the carrier is preferably at a standstill. If a coil is added to a track and the coil is in the error state, the track to which the coil is added goes preferably to an error or fatal error state.

In another embodiment a memory device is disclosed, which allows also an adjustment of a position of the carrier. Therefore, an adjustment table may be used for each carrier. Such a table may contain the position adjustment for the inaccuracy of the magnets of the magnet plate of a carrier. This helps to improve the position accuracy of the carriers and also reduces the velocity ripple.

In another preferred embodiment it is also possible to add and/or remove two physical different coils to the same track begin and/or track end, but preferably not at the same time.

Also preferably it is possible to move at least two coils as the set from a track begin or a track end to another track begin to another track end.

In another preferred embodiment only one carrier is allowed on a set of coils and the set preferably comprises its own sensor devices especially hall sensors. Therefore, there are preferably no shared sensors for more than one carrier. Also carriers may be provided which are longer than for example two coils which comprises especially two sensors per coil.

In another preferred embodiment it is possible to free a certain area of at least one track from carriers. This movement will be made preferably in a velocity mode (where the carriers are not in their home position) and will preferably stop until the sensors inside this areas of the track do not detect any more carrier.

In another application it may occur that the magnet plates of two carriers are placed against each other. If the application only wants to move one carrier (especially by using the coil below that carrier), the other carrier should be held at its place.

It is therefore preferred that carriers inside the requested area of the track will move in the velocity loop and that carriers outside the requested area will be held in place. It is therefore preferred that only one area of the track can be active on one track at the same time.

The present disclosure is also directed to a method for transporting piece goods, wherein the piece goods are transported by a first carrier along a first transport track and by a second carrier along a second transport track, wherein for moving the carriers with respect to the transport track coil arrangements are provided.

According to the disclosure at least in time a coil arrangement is displaced from one track to the other track, especially together with the at least one carrier.

In another preferred embodiment a plurality of carrier is provided which may be moved with respect to two or more tracks. In another preferred embodiment the carrier is at least in time coupled to the coil arrangement. Especially the carrier is coupled to the coil arrangement, while the coil arrangement is displaced from one track to another track.

In another preferred embodiment a displacement direction differs preferably from the transport direction, especially the displacement direction may be perpendicular to the transport direction.

In another preferred embodiment the carriers are displaced between end sections of the tracks.

In another preferred embodiment the arrangement comprises at least three transport tracks. Especially at least one carrier can be transported with respect to at least two of those three transport tracks. In another embodiment, at least two transport tracks intersect with each other in their transport direction. This means, that in a geometric area which extends perpendicular to the transport direction of the two transport tracks, both transport tracks are present. In this area the carriers may be displaced from one transport track to the other.

BRIEF DESCRIPTION OF THE DRAWINGS

Other advantages or embodiments of the disclosure will be become apparent from the attached drawings. Therein shown.

DETAILED DESCRIPTION

Figure 1:
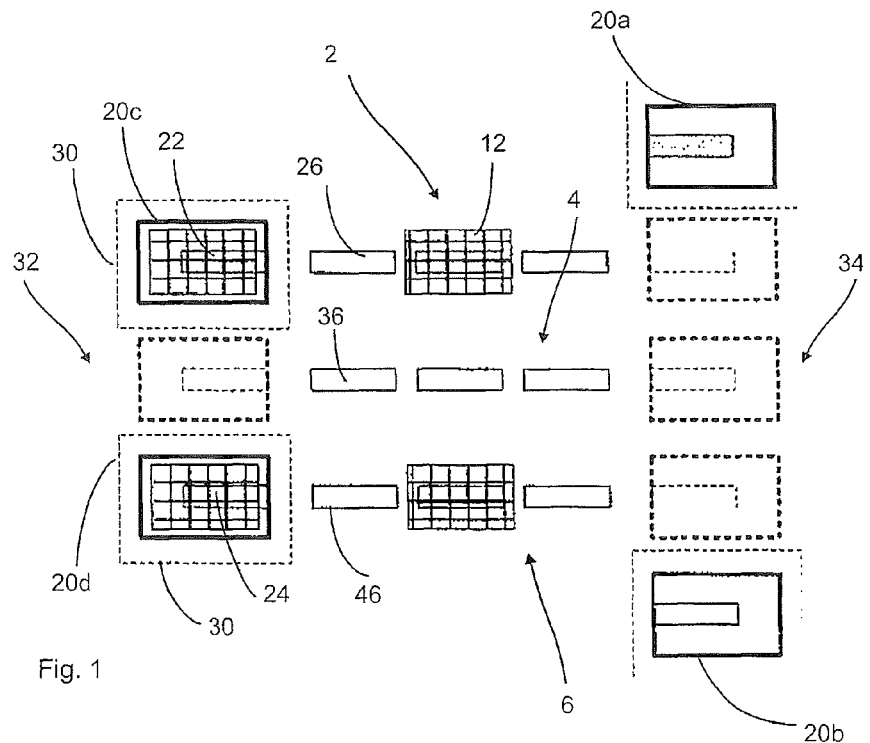
FIG. 1 a first arrangement according to the disclosure.

FIG. 1 shows a transport arrangement for which the disclosure applies. This transport arrangement comprises here three transport tracks 2, 4 and 6, by which carriers can be transported here in a horizontal direction. These transport tracks are here parallel to each other. Reference numeral 30 is directed to a process chamber to treat the piece goods, here wafers.

The arrangement comprises two load positions wherein in the figure in the first load position a shuttle 20a is arranged in the moment and wherein in the second load position another shuttle 20b is arranged in the moment. The carriers 12 are transported to the process chambers 30 by the two tracks 2 and 6 and returned back via the track 4. On the two sides of the respective tracks 2, 4, 6 two vertical tracks 32, 34 are arranged which serve to displace the carriers from the tracks 2 and 6 to the track 4. To this purpose two more shuttles 20c and 20d are provided.

To each of the shuttles 20a - 20d a coil arrangement is mounted. To move the carrier 12 from the track 2 to the track 4, the respective shuttle (for example 20c) is moved together with the coil 22 coupled to it. Therefore the coils coupled to the shuttles 20a-20d can each belong to two of the three transport tracks 2, 4, 6. The coil 24 is coupled two the shuttle 20d. The coils 26, 36 and 46 are stationary coils, which are a part of the transport tracks 4, 6 and 8 respectively.

Figure 2:
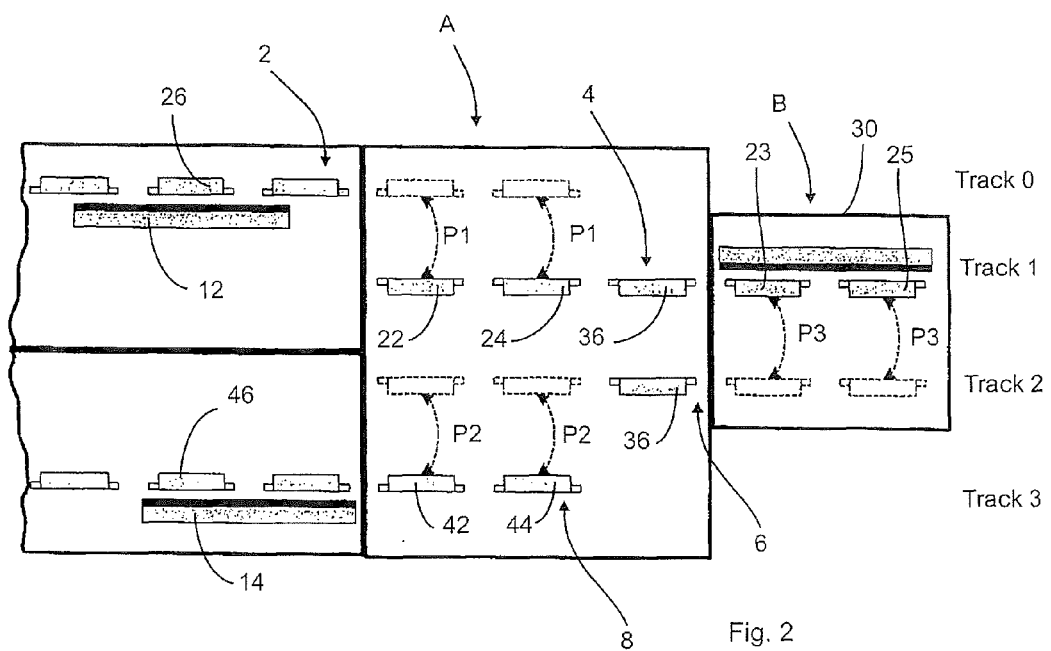
FIG. 2 another arrangement for moving carriers.

FIG. 2 shows another transport arrangement 1 according to the disclosure. Here four transport tracks 2, 4, 6, 8 (also mentioned as Track0, Track1, Track2 and Track3) are provided. Carriers 12 may be transported on each of the tracks.

One can see, that all four transport tracks 2, 4, 6, 8 intersect in their horizontal direction in an area A. This area therefore marks the end or beginning sections respectively of the four transport tracks. Reference numerals 26, 36 and 46 refer to coil arrangements which are arranged stationary and are always part of a certain transport track. In contrast, the coil arrangements 22, 24 can be moved between at least two transport tracks. In the figure, the coil arrangements 22 can be moved from the transport track 2 to the transport track 4 and vice versa, as shown by arrow P1. In the area B only the two tracks 4 and 6 intersect in the horizontal direction. Therefor the region A is also the beginning section of the tracks 4 and 6 while the region B is the end section for these two tracks 4 and 6.

The coil arrangements 42, 44 can be moved between the transport track 6 and 8 (arrow P2) and the coil arrangements 23, 25 can be moved between the transport tracks 4 and 6 (arrow P3).

Figure 3:
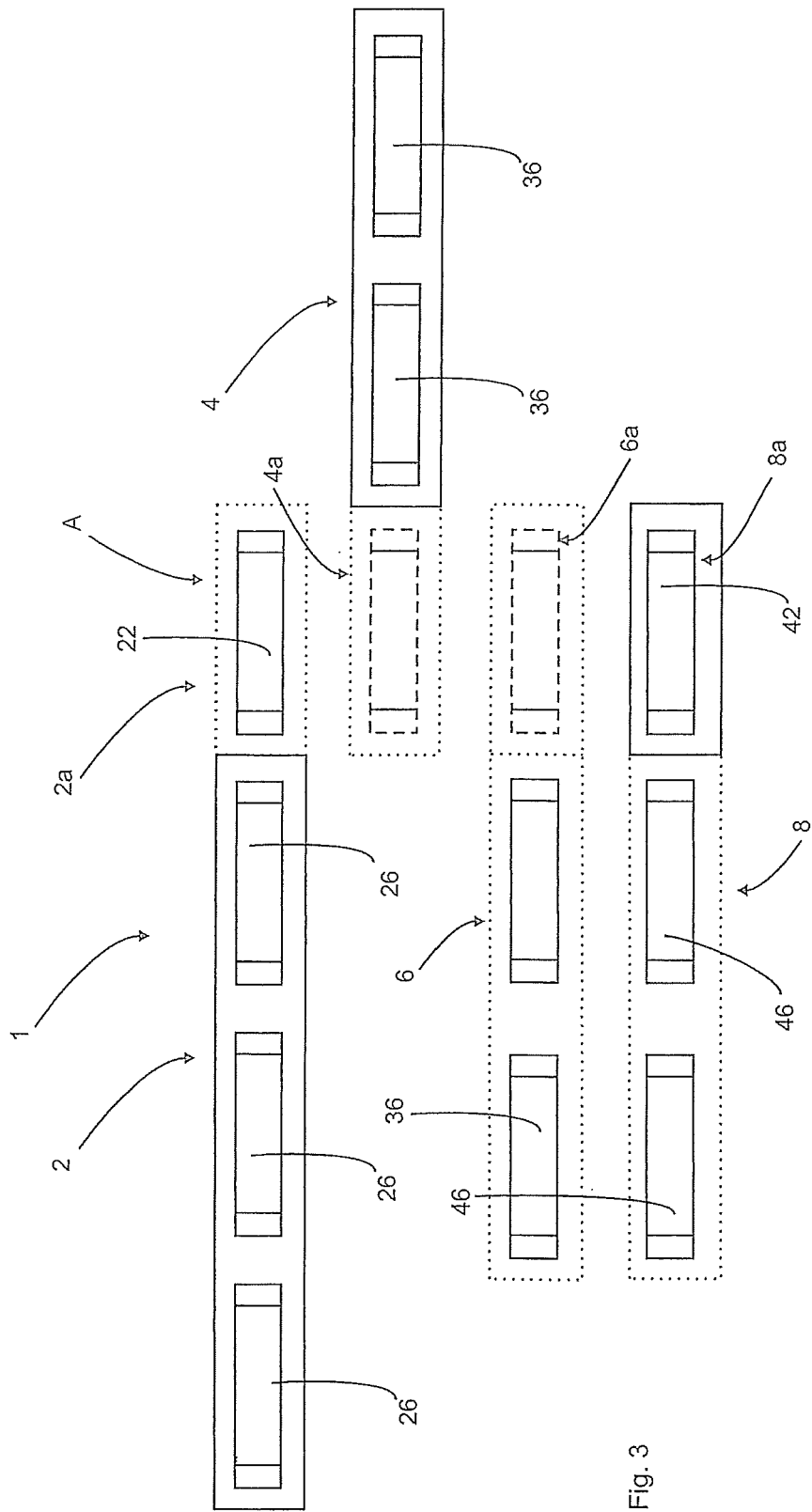
FIG. 3 a schematic illustration of the principle underlying the disclosure.

FIG. 3 shows another transport arrangement 1 according to the disclosure. Here, four horizontal tracks 2, 4, 6, 8 are provided, which intersect in the area A. In this area A therefor also the beginning or end sections 2a, 4a, 6a, 8a of the four transport tracks 2, 4, 6, 8 are provided. The reference symbol 26, 36, 46 again are directed to the coil arrangements which are stationary and belong to one track only. In contrast, the coil arrangements 22 and 42 can be moved between two tracks each.

LIST OF REFERENCE NUMERALS 1 transport arrangement
2, 4, 6, 8 transport track
2a, 4a, 6a, 8a end sections of transport tracks
12 carrier
20a-20d shuttles
22, 23, 24 coil arrangements movable between tracks
25, 42, 44
26 stationary coil arrangement (belonging to one transport track only)
30 process chamber
32, 34 vertical tracks
A, B regions
P1-P3 arrows

What is claimed is:
1. A transport arrangement for transporting piece goods, comprising:
a first transport track;
a first carrier movable with respect to the first transport track;
a second transport track;
a second carrier movable with respect to the second transport track;
at least one first coil arrangement configured to move the first carrier with respect to the first transport track;
at least one second coil arrangement configured to move the second carrier with respect to the second transport track; and a first identification element of the first carrier configured to unambiguously define the first carrier, wherein at least one coil arrangement of the at least one first coil arrangement and the at least one second coil arrangement is configured to move, at least at times, the first carrier with respect to the first transport track and, at least at times, to move the second carrier with respect to the second transport track.

2. The transport arrangement according to claim 1, wherein the at least one coil arrangement is configured to move one of the first carrier with respect to the first transport track and the second carrier with respect to the second transport track.

3. The transport arrangement according to claim 1, wherein the at least one coil arrangement is displaceable between the first transport track and the second transport track.

4. The transport arrangement according to claim 3, wherein the at least one coil arrangement is displaceable between at least one end section of one track to a section of another track.

5. The transport arrangement according to claim 1, wherein the at least one coil arrangement comprises at least two coils.

6. The transport arrangement according to claim 1, wherein at least one section of the first transport track is arranged adjacent to at least one section of the second transport track.

7. The transport arrangement according to claim 6, wherein one section of the first transport track comprises, at least at times, a receiving space for receiving the at least one coil arrangement.

8. The transport arrangement according to claim 1, wherein a coupling mechanism is provided which, at least at times, couples a carrier to the at least one first coil arrangement or the at least one second coil arrangement.

9. The transport arrangement according to claim 1, wherein:
   the first identification element is prevented from being changed or assigned to the second carrier,
   a second identification element of the second carrier unambiguously defines the second carrier, and
   the second identification element is prevented from being changed or assigned to the first carrier.

10. The transport arrangement according to claim 1, wherein at least one of (i) the at least one first coil arrangement, (ii) the at least one second coil arrangement, (iii) the first carrier, and (iv) the second carrier comprises a sensor device configured to sense at least one characteristic feature of the transport arrangement.

* * * * *